(12) United States Patent
Verlinden et al.

(10) Patent No.: US 10,250,269 B2
(45) Date of Patent: Apr. 2, 2019

(54) OSCILLATOR SYSTEM

(71) Applicant: NXP B.V., Eindhoven (NL)

(72) Inventors: Jos Verlinden, Wachtendonk (DE); Sander Derksen, Hank (NL); Dobson Paul Parlindungan Simanjuntak, Eindhoven (NL); Remco Cornelis Herman Van de Beek, Waalre (NL)

(73) Assignee: NXP B.V., Eindhoven (NL)

( * ) Notice: Subject to any disclaimer, the term of this patent is extended or adjusted under 35 U.S.C. 154(b) by 115 days.

(21) Appl. No.: 15/657,255

(22) Filed: Jul. 24, 2017

(65) Prior Publication Data

US 2019/0028110 A1    Jan. 24, 2019

(51) Int. Cl.

| | | |
|---|---|---|
| *H03L 7/097* | (2006.01) | |
| *H03K 5/24* | (2006.01) | |
| *H03K 19/00* | (2006.01) | |
| *H03K 5/08* | (2006.01) | |
| *H03K 3/0231* | (2006.01) | |
| *H03K 3/03* | (2006.01) | |

(52) U.S. Cl.
CPC ........... *H03L 7/097* (2013.01); *H03K 3/0231* (2013.01); *H03K 3/0315* (2013.01); *H03K 5/082* (2013.01); *H03K 5/249* (2013.01); *H03K 5/2481* (2013.01); *H03K 19/0027* (2013.01)

(58) Field of Classification Search
CPC ...................................................... H03L 7/097
USPC ............................................................ 331/23
See application file for complete search history.

(56) References Cited

U.S. PATENT DOCUMENTS

| | | |
|---|---|---|
| 5,994,967 A | 11/1999 | Nguyen |
| 6,353,368 B1 | 3/2002 | Iravani |

(Continued)

OTHER PUBLICATIONS

Choi, M., "A 110 nW Resistive Frequency Locked On-Chip Oscillator with 34.3 ppm/°C Temperature Stability for System-on-Chip Designs", IEEE Journal of Solid-State Circuits, vol. 51, No. 9, Sep. 2016.

(Continued)

*Primary Examiner* — Joseph Chang
(74) *Attorney, Agent, or Firm* — David G. Dolezal

(57) ABSTRACT

An oscillator system includes a voltage controlled oscillator (VCO) circuit. The VCO circuit includes an output for providing an oscillation signal and input to receive a voltage that controls the frequency of the oscillation signal. The oscillator system includes a frequency to voltage circuit that receives the oscillation signal and produces a voltage that is dependent upon the frequency of the oscillation signal. The oscillator system includes a comparison circuit including an amplifier. The amplifier includes an inverting input, a non inverting input, and an output. During a first phase of the comparison circuit, the non inverting input receives a reference voltage and the inverting input is coupled to the output of the amplifier via a switch and to a capacitor wherein the capacitor samples the voltage of the output. During a second phase of the comparison circuit, the non inverting input receives the voltage produced by the frequency to voltage circuit and the switch between amplifier output and inverting input is open wherein the inverting input is coupled to the capacitor to receive the sampled voltage value. During the second phase, the output of the amplifier is provided to the input of the VCO circuit.

20 Claims, 6 Drawing Sheets

(56) References Cited

U.S. PATENT DOCUMENTS

| | | | |
|---|---|---|---|
| 8,994,459 | B2 | 3/2015 | Patasani et al. |
| 2002/0041217 | A1* | 4/2002 | Crofts .................. H03K 3/0231 |
| | | | 331/175 |
| 2009/0146746 | A1 | 6/2009 | Unkrich et al. |
| 2010/0225406 | A1 | 9/2010 | Shikata |
| 2010/0231307 | A1 | 9/2010 | Walley |
| 2010/0271139 | A1 | 10/2010 | Shikata |
| 2011/0175666 | A1 | 7/2011 | Ballenegger |
| 2012/0306580 | A1 | 12/2012 | Ellis |
| 2013/0021105 | A1 | 1/2013 | Leoncavallo |
| 2013/0082784 | A1 | 4/2013 | Chiu et al. |
| 2015/0180483 | A1 | 6/2015 | Astrom et al. |
| 2016/0026209 | A1 | 1/2016 | Leme et al. |
| 2017/0307668 | A1* | 10/2017 | Buffa .................. G01R 27/2605 |

OTHER PUBLICATIONS

Abidi, A., "Linearization of Voltage-Controlled Oscillators Using Switched-Capacitor Feedback"; IEEE Journal of Solid-Statecircuits, vol. SC-22, No. 3, Jun. 1987.

Choe, K., "A precision relaxation oscillator with a self-clocked offset-cancellation scheme for implantable biomedical SoCs," ISSCC Dig. Tech. Papers, pp. 402-403, Feb. 2009.

Denier, U., "Analysis and Design of an Ultralow-Power CMOS Relaxation Oscillator," IEEE Transactions on Circuits and Systems I: Regular Papers, vol. 57, No. 8, pp. 1973, 1982, Aug. 2010.

Griffith, D., "190nW 33kHz RC oscillator with ±0.21% temperature stability and 4ppm long-term stability," IEEE International Solid-State Circuits Conference Digest of Technical Papers (ISSCC), pp. 300-301, Feb. 2014.

Hsiao, Keng-Jan, "A 32.4 ppm/°C 3.2-1.6V self-chopped relaxation oscillator with adaptive supply generation," Proc. VLSI Symposium, pp. 14-15, Jun. 2012.

Kashmiri, S.M., "A scaled thermal-diffusivity-based frequency reference in 0.16µm CMOS," Proceedings of the ESSCIRC, pp. 503,506, Sep. 2011.

Kugelstadt, T., "Auto-zero amplifiers ease the design of high-precision circuits", Analog Applications Journal, 2Q 2005.

Le, NPT, "High Linearity Voltage-Controlled Oscillator", Department of Electrical and Computer Engineering, Faculty of Engineering, National University of Singapore, IEEE 2009.

Lee, J., "4.7MHz 53µW fully differential CMOS reference clock oscillator with −22dB worst-case PSNR for miniaturized SoCs,", ISSCC Dig. Tech. Papers vol., pp. 13, Feb. 2015.

McCorquodale, M.S., "A Silicon Die as a Frequency Source", IEEE International Frequency Control Symposium, Jun. 2010.

Paidimarri, A., "A 120nW 18.5kHz RC oscillator with comparator offset cancellation for ±0.25% temperature stability," ISSCC, pp. 184-185, Feb. 2013.

Sebastiano, F., "A 65-nm CMOS temperature-compensated mobility-based frequency reference for wireless sensor networks," in Proc. ESSCIRC, 2010, pp. 102-105.

Ueno, K., "A 30-MHz, 90-ppm/°C fully-integrated clock reference generator with frequency-locked loop," Proc. ESSCIRC, pp. 392-395, Sep. 2009.

Notice of Allowance dated Feb. 4, 2019 in U.S. Appl. No. 15/657,250.

* cited by examiner

US 10,250,269 B2

OSCILLATOR SYSTEM

BACKGROUND OF THE INVENTION

Field of the Invention

This invention relates in general to oscillator systems.

Description of the Related Art

Oscillator systems are used by electronic systems for providing clock signals or other alternating signals at a particular frequency.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

Figure 1:
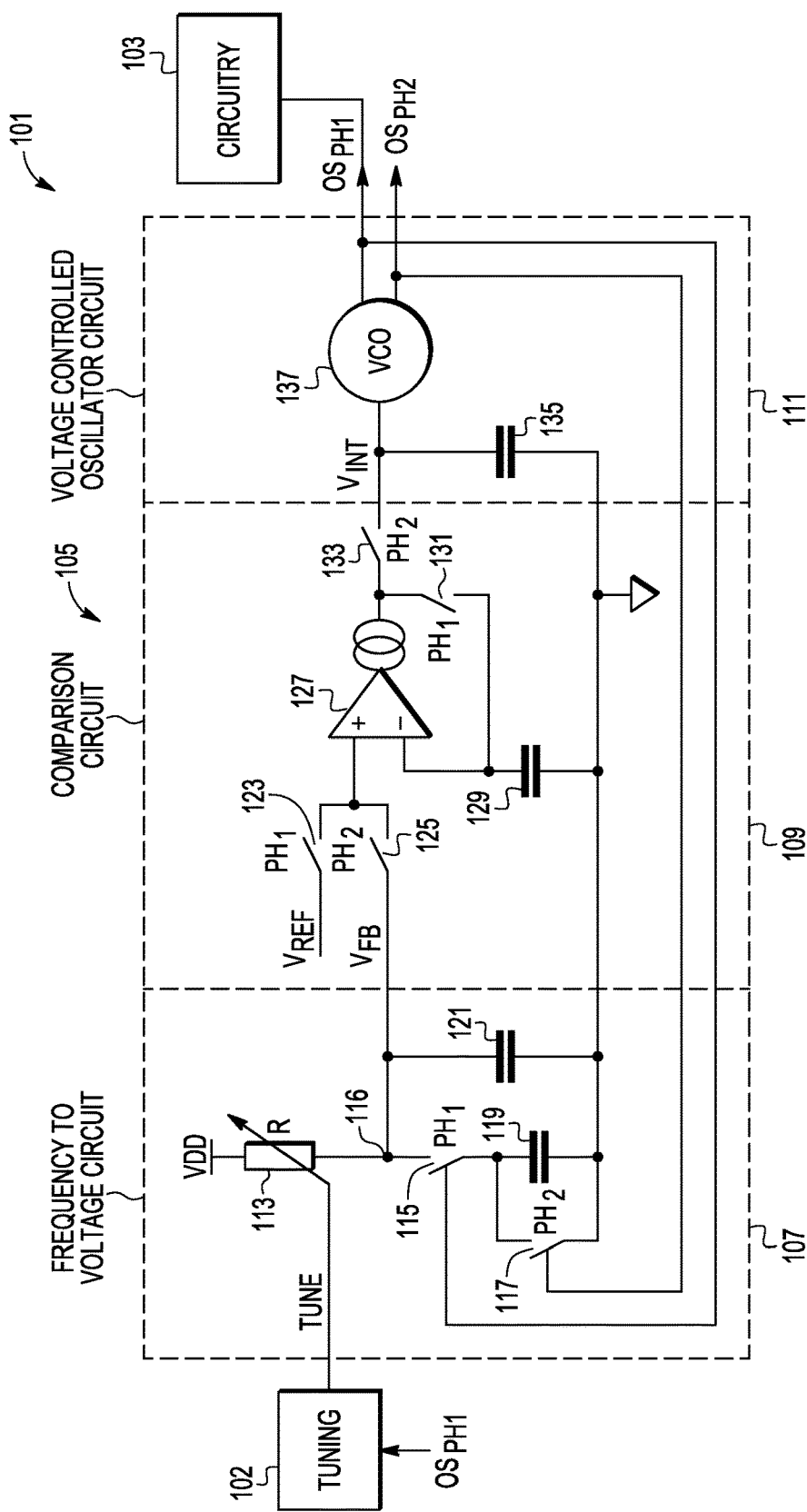
FIG. 1 is a circuit diagram of an integrated circuit with an oscillator system according to one embodiment of the present invention.

The following sets forth a detailed description of a mode for carrying out the invention. The description is intended to be illustrative of the invention and should not be taken to be limiting.

As disclosed herein, an oscillator system includes a voltage controlled oscillator (VCO) circuit. The VCO circuit includes an output for providing an oscillation signal and input to receive a voltage that controls the frequency of the oscillation signal. The oscillator system includes a frequency to voltage circuit that receives the oscillation signal and produces a voltage that is dependent upon the frequency of the oscillation signal. The oscillator system includes a comparison circuit including an amplifier. The amplifier includes an inverting input, a non inverting input, and an output. During a first phase of the comparison circuit, the non inverting input receives a reference voltage and the inverting input is coupled to the output of the amplifier via a switch and to a capacitor wherein the capacitor samples the voltage of the output. During a second phase of the comparison circuit, the non inverting input receives the voltage produced by the frequency to voltage circuit and the switch between amplifier output and inverting input is open wherein the inverting input is coupled to the capacitor to receive the sampled voltage value. During the second phase, the output of the amplifier is provided to the input of the VCO circuit.

With some prior art oscillator systems, the output of a frequency to voltage circuit is compared with a reference voltage by an amplifier to provide the input voltage to the VCO circuit to control the frequency of the VCO circuit. The reference voltage is set such that the voltage value of the frequency to voltage circuit output matches the reference voltage at the desired oscillation frequency of the VCO circuit. If the output of the frequency to voltage circuit differs from the reference voltage, then the amplifier adjusts its output to change the frequency of the VCO circuit so that the voltage of the output of the frequency to voltage circuit matches the reference voltage.

One issue that may occur with such prior art systems is that mismatches and flicker noise in the devices of the amplifier can produce an offset voltage in the amplifier output. The offset voltage can reduce the frequency accuracy of the oscillator system and the flicker noise can reduce the frequency stability of the oscillator system.

With some embodiments of a multi-phase comparison circuit described herein, the effects of the flicker noise and offset voltage caused by mismatches of the devices of the amplifier can be negated or minimized due to the canceling out the offset voltage by generating a sampled voltage of the output of the amplifier during a sampling phase and comparing the output of the frequency to voltage circuit with the sampled voltage during a comparison phase to generate a voltage for controlling the frequency of the voltage controlled oscillator circuit.

FIG. 1 is a circuit diagram of one embodiment of an integrated circuit 101 with an oscillator system 105 for providing an oscillation signal $OS_{PH1}$ to circuitry 103 of integrated circuit 101. In some embodiments, circuitry 103 uses the oscillation signal $OS_{PH1}$ as a clock signal for providing timing and synchronization of the operations of circuitry 103. In some embodiments, circuitry 103 may include e.g. processors, memories, sensors, digital logic, analog circuitry, analog to digital converters, microcontrollers, and/or transceivers. In some embodiments, system 105 may provide multiple oscillation signals to circuitry 103 where each oscillation signal may be at a different frequency, phase, and/or duty cycle from the other oscillation signals. Although FIG. 1 shows that circuitry 103 and oscillator system 105 are on the same integrated circuit 101, in other embodiments, circuitry 103 and system 105 maybe located on different integrated circuits. In still other embodiments, portions of either circuitry 103 or system 105 each may be located on different integrated circuits and/or be implemented with other electronic components. Integrated circuit 101 can be implemented in an electronic system such as e.g., a computer, smartphone, tablet, automobile electronic system, an appliance, router, base station, or television.

Oscillator system 105 includes a voltage controlled oscillator circuit 111, a comparison circuit 109, and a frequency to voltage circuit 107. A voltage controlled oscillator circuit is a circuit that produces an oscillation signal whose frequency is controllable by an input voltage. In the embodiment shown, VCO circuit 111 includes a voltage controlled oscillator (VCO) 137 whose input voltage ($V_{INT}$) controls the frequency of the oscillation signals $OS_{PH1}$ and $OS_{PH2}$ produced by VCO 137. In one embodiment, an increase or decrease in the voltage level of $V_{INT}$ provides for a corresponding increase or decrease in the frequency of oscillation signals $OS_{PH1}$ and $OS_{PH2}$. In the embodiment shown, $OS_{PH1}$ and $OS_{PH2}$ are at the same frequency but are 180 degrees out of phase with each other and have a 50% duty cycle. In other embodiments, VCO circuit 111 may produce other clock signals at different phases, frequencies, and/or duty cycles. VCO circuit 111 includes an input capacitor 135 for sampling at the input of VCO circuit 111, the output voltage of amplifier 127 during a comparison phase when switch 133 is closed and for holding the sampled voltage when switch 133 is open. In some embodiments, VCO circuit 111 may include frequency dividers (not shown) for dividing down the frequency of an oscillation signal for providing a lower frequency clock signal or feedback signal to other circuits. In other embodiments, a VCO circuit may have other configurations and/or include other devices. In one embodiment, oscillation signals $OS_{PH1}$ and $OS_{PH2}$ have a frequency in the range of 10 k-10 MHz, but may have other frequencies in other embodiments. In some embodiments, oscillator system 105 is characterized as a relaxation oscillator circuit.

In the embodiment shown, system 105 is a two phase system that includes multiple switches that are open or closed during the different phases of operation. In FIG. 1, switches 115, 123, and 131 are labeled with PH1 to indicate that they are closed during Phase 1 and open during Phase 2, and switches 117, 125, and 133 are labeled with PH2 to indicate that they are closed during Phase 2 and open during Phase 1. In the embodiment shown, the conductivity of switches 115, 123, and 131 are controlled by oscillation signal $OS_{PH1}$ and the conductivity of switches 117, 125, and 133 are controlled by oscillation signal $OS_{PH2}$. In the embodiment of FIG. 1, oscillation signals $OS_{PH1}$ and $OS_{PH2}$ are provided to both circuits 107 and 109 with FIG. 1 showing the oscillation signal lines from circuit 111 to circuit 107. In one embodiment, because oscillation signals $OS_{PH1}$ and $OS_{PH2}$ are at the same frequency and duty cycle but are 180 degrees out of phase with each other, Phase 1 and Phase 2 are of the same duration and occur during alternating periods. In other embodiments, they may be at different frequencies, have different phase relationships, and/or have different duty cycles. In other embodiments, only one oscillator signal is provided to circuit 107 and comparison circuit 109 where one set of switches (115, 123, and 131) is closed and the other set of switches (117, 125, and 133) are open when the oscillation signal is at a high state and vice versa at a low state. In one embodiment, the switches are implemented with N channel MOSFETS, but some or all of the switches may be implemented with other types of switches such as P channel MOSFETS, passgates, other types of transistors, or relay devices in other embodiments. In the embodiment shown, the operating phases of circuit 107 and the operating phases of circuit 109 occur at the same time, but in other embodiments, they may occur at different times and/or independently from each other.

System 105 includes a frequency to voltage circuit 107 that receives the oscillation signals $OS_{PH1}$ and $OS_{PH2}$ and produces an output voltage ($V_{FB}$) whose value is indicative of the frequency of the oscillation signals. In the embodiment shown, frequency to voltage circuit 107 is implemented with a switched resistor capacitor circuit. Frequency to voltage circuit 107 is implemented in a time discrete configuration. However, in other embodiments, circuit 107 may be implemented in a time continuous configuration. Other types of frequency to voltage circuits may be used in other embodiments such as a switched LC, LR, or LRC circuit. Also, time continuous frequency to voltage converters with various combinations of inductors, capacitors and resistors may be implemented as well.

In the embodiment shown, both oscillation signals $OS_{PH1}$ and $OS_{PH2}$ are provided to circuit 107, but in other embodiments, a different number of oscillation signals (e.g. 1 or 3 or more) from circuit 111 are provided to circuit 107. In the embodiment shown, $OS_{PH1}$ is provided to both circuitry 103 and circuit 107 at the same frequency. However, in other embodiments, VCO circuit 111 includes a frequency divider (not shown) for reducing the frequency of $OS_{PH1}$ and/or $OS_{PH2}$ before providing to circuit 107.

In the embodiment shown, frequency to voltage circuit 107 includes a variable resistor 113, capacitors 119 and 121, and switches 115 and 117. During Phase 1, switch 115 is closed and switch 117 is open to charge capacitor 119. During Phase 2, switch 115 is open and switch 117 is closed to discharge capacitor 119. The voltage level of voltage $V_{FB}$ is dependent upon how often capacitor 119 is charged and discharged, removing a net charge giving an average current flow through the resistor 113. Capacitor 121 provides the charge needed to charge capacitor 119 at the moment switch 115 is closed and is continuously charged by resistor 113. The higher the frequency of the oscillator signals, the lower $V_{FB}$ and vice versa.

In FIG. 1, resistor 113 is tunable by a tuning circuit 102 to change the response of $V_{FB}$ to the frequency of the oscillator signals $OS_{PH1}$ and $OS_{PH2}$ for tuning the frequency of $OS_{PH1}$ and $OS_{PH2}$. In some embodiments, changing the resistor value of resistor 113 changes the frequency response of oscillator system with respect to $V_{REF}$. In one embodiment, tuning circuit 102 receives the oscillation signal $OS_{PH1}$ and provides a tune value (TUNE) based on a comparison of the $OS_{PH1}$ signal with another reference oscillator signal (not shown) or a stored value indicative of a desired frequency that was set during manufacture. In other embodiments, tuning circuit 102 does not receive the oscillation signal $OS_{PH1}$ where the tune value can be set during manufacture and stored in a non volatile memory (not shown). In other embodiments, resistor 113 is fixed. In other embodiments, circuit 107 can have other configurations.

Comparison circuit 109 includes an amplifier 127 with a non inverting input (+), an inverting input (−), and an output. In the embodiment shown, amplifier 127 is an operational transconductance amplifier (OTA), but can be another type of amplifier in other embodiments. Circuit 109 includes switch 123 that is closed during Phase 1 and open during Phase 2 to provide a reference voltage ($V_{REF}$) to the non inverting input during Phase 1. Circuit 109 includes switch 125 that is closed during Phase 2 and open during Phase 1 to couple the output of circuit 107 to the non inverting input during Phase 2. Circuit 109 includes switch 131 that is closed during Phase 1 and open during Phase 2 to couple the output of amplifier 127 to the inverting input and to capacitor 129 to sample the voltage of the output of amplifier 127 during Phase 1. Switch 133 is closed during Phase 2 to couple the output of amplifier 127 to the input of VCO circuit 111.

Comparison circuit 109 is a multi-phase comparison circuit that compares the output voltage $V_{FB}$ of circuit 107 with $V_{REF}$ in multiple phases. In a sampling phase (Phase 1) of comparison circuit 109, the non inverting input of amplifier 127 is coupled to receive $V_{REF}$ from a voltage reference source (not shown in FIG. 1) and the inverting input is coupled to the output of amplifier 127 via a closed switch 131 wherein the output voltage of amplifier 127 is sampled by capacitor 129 during Phase 1. The voltage level of the output of amplifier 127 during Phase 1 tracks to $V_{REF}$ minus the offset voltage ($V_{OFFSET}$) of amplifier 127. The offset voltage of amplifier 127 is due to mismatches of its devices.

During a comparison phase (Phase 2) of circuit 109, switch 123 is open and switch 125 is closed to provide $V_{FB}$ to the non inverting input of amplifier 127. Switch 131 is open and switch 133 is closed to provide the output of amplifier 127 to the input of VCO circuit 111. During the comparison phase, the output voltage ($V_{INT}$) of amplifier 127 is sampled by capacitor 135 and is held during the following sampling phase.

Because the sampled voltage of capacitor 129 is provided to the inverting input of amplifier 127 during the comparison phase, the output voltage ($V_{FB}$) from circuit 107 is compared by amplifier 127 to a voltage value ($V_{REF}-V_{OFFSET}$) that accounts for the offset voltage of amplifier 127. Accordingly, the offset voltage ($V_{OFFSET}$) of the amplifier 127 is zeroed out during the comparison phase wherein the effect of the offset voltage on the accuracy and noise of system 105 are minimized.

$V_{REF}$ can be generated from a number of different types of voltage reference sources such as a voltage divider, a capacitor divider, a Zener diode, or a band gap voltage reference (none shown in FIG. 1). In one embodiment, $V_{REF}$ can be calibrated or adjusted (either during manufacture or during operation) to tune the frequency of oscillator system 105 or to provide oscillation signals at different frequencies for different operating modes of integrated circuit 101. Comparison circuit 109 may have other configurations in other embodiments.

Figure 2:
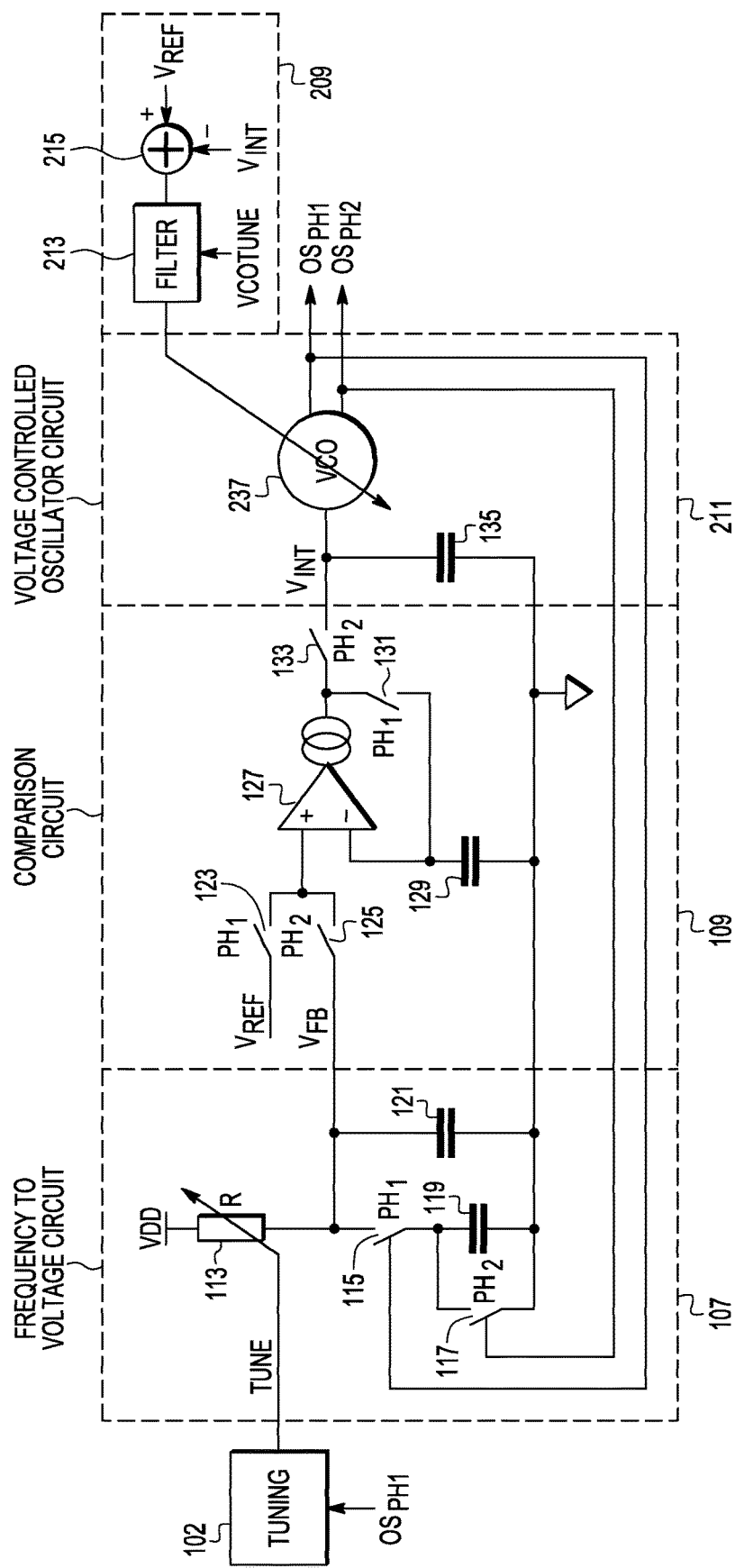
FIG. 2 is a circuit diagram of an oscillator system according to another embodiment of the present invention.

FIG. 2 is a circuit diagram of an oscillator system 205 according to another embodiment of the present invention. Oscillator system 205 is similar to oscillator system 105 where the same reference numbers indicate similar devices and functions (e.g. circuits 107 and 109 have same configuration and work the same in both embodiments). System 205 is different from system 105 in that system 205 includes a tuning circuit 209 for tuning a tunable VCO 237. In the embodiment shown, tuning circuit 209 includes a voltage adder 215 that compares $V_{REF}$ to the input voltage of circuit 211 ($V_{INT}$). The resultant from adder 215 is filtered by low pass filter 213 to produce an output that adjusts the frequency response of VCO 237 with respect to $V_{INT}$ through negative feedback so that $V_{INT}$ will match $V_{REF}$. In one embodiment, the passband of filter 213 is below the frequency of $OS_{PH1}$ and $OS_{PH2}$. The filter parameters can be tuned by a tune value (VCOTUNE) that can be set during manufacture or adjusted during circuit operation. In some embodiments, the VCOTUNE value can be set to tune the VCO characteristics, to compensate for a variation in power supply voltages, to improve phase noise performance, to compensate for temperature, and/or to control current consumption. In some embodiments, providing a tuning circuit 209 for tuning the frequency response of the VCO circuit may advantageously in some embodiments, provide for a circuit with better noise performance, frequency stability and better power efficiency. In another embodiment, other signals beside $V_{INT}$, $V_{REF}$ can be used in the comparison for optimizing the oscillator system 205.

Figure 3:
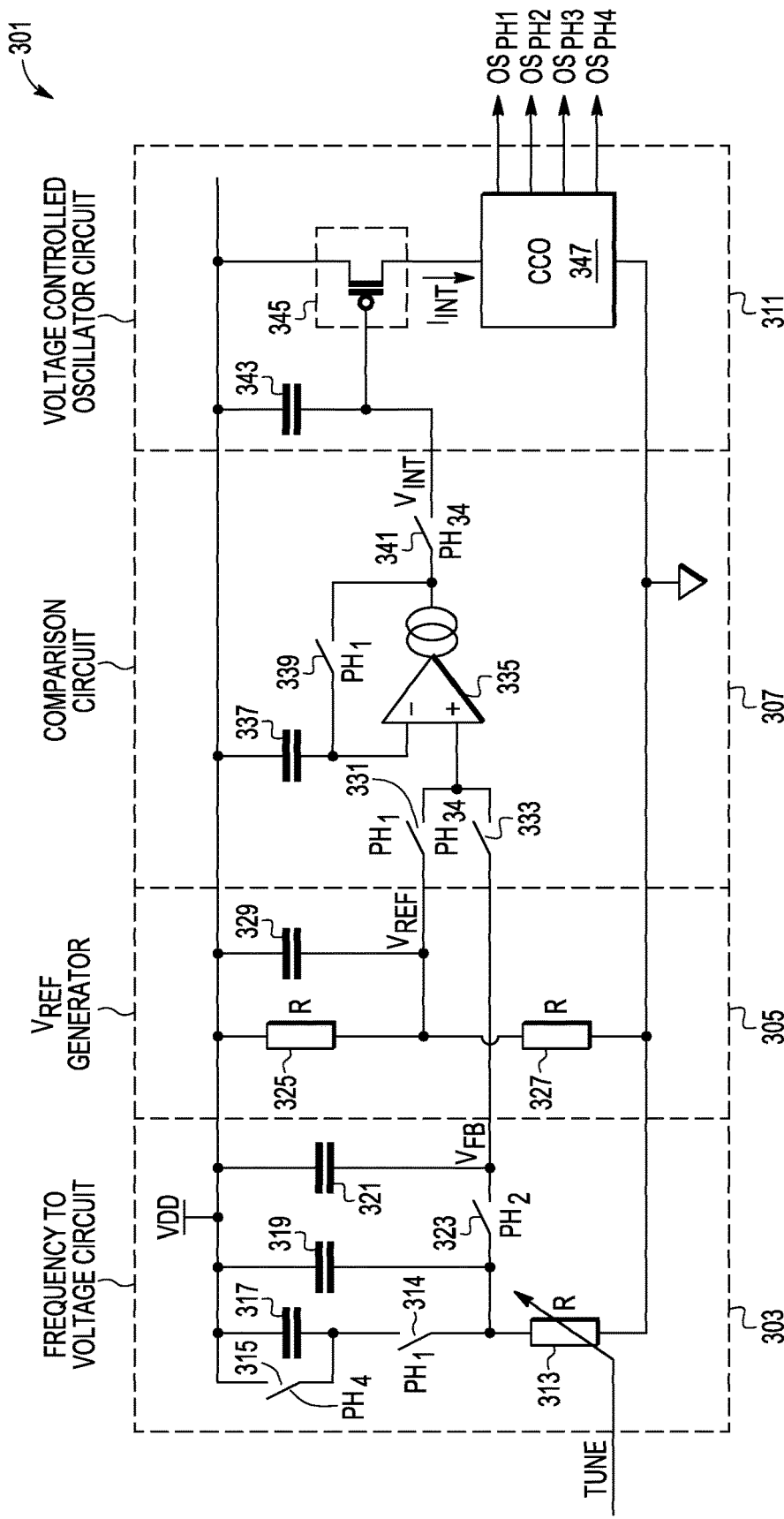
FIG. 3 is a circuit diagram of an oscillator system according to another embodiment of the present invention.
Figure 4:
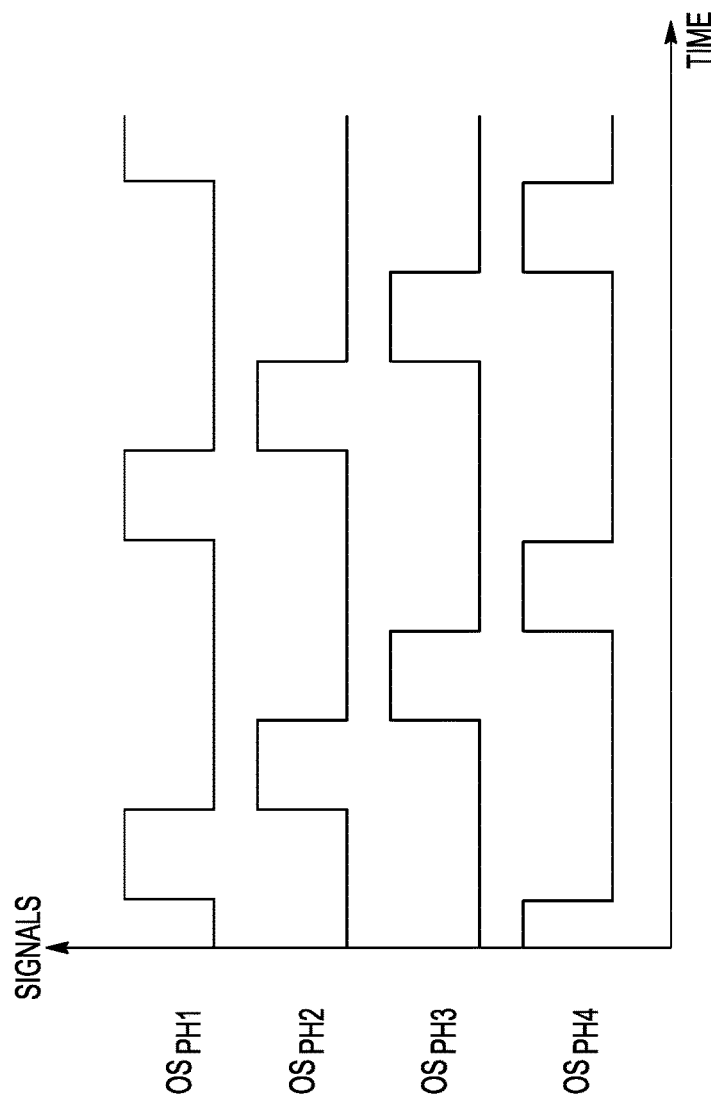
FIG. 4 is a timing diagram of oscillation signals produced by an oscillator system according to one embodiment of the present invention.

FIG. 3 is a circuit diagram of an oscillator system 301 according to another embodiment of the present invention. System 301 includes a voltage controlled oscillator circuit 311 that includes a current controlled oscillator 347 which is shown generating four oscillator signals $OS_{PH1}$, $OS_{PH2}$, $OS_{PH3}$, and $OS_{PH4}$. FIG. 4 shows a timing diagram of the four oscillator signals $OS_{PH1}$, $OS_{PH2}$, $OS_{PH3}$, and $OS_{PH4}$. As shown in FIG. 4, each of the four oscillator signals is at the same frequency and duty cycle (25 percent) but are shifted by 90 degrees to provide four phases per clock cycle.

Referring back to FIG. 3, system 301 includes a number of switches, each with the designation of the phase or phases in which the switch is closed. Each switch is open for all other phases other than the phase designated. For example, switch 333 has a phase designation of $PH_{34}$ which indicates that the switch is closed for Phase 3 and Phase 4 and open for Phase 1 and Phase 2. The switches are controlled by the four oscillation signals $OS_{PH1}$, $OS_{PH2}$, $OS_{PH3}$, and $OS_{PH4}$ to close and open during the phases as indicated in FIG. 3.

VCO circuit 311 includes a voltage to current circuit, which in the embodiment shown is implemented as a P channel transistor 345 configured to operate as an input voltage controlled current source. In another embodiment, the voltage to current circuit can be implemented as a cascoded P channel transistor. Transistor 345 converts input voltage $V_{INT}$ to a current ($I_{INT}$) for controlling the frequency of the four oscillation signals $OS_{PH1}$, $OS_{PH2}$, $OS_{PH3}$, and $OS_{PH4}$. Capacitor 343 is for sampling and holding the output voltage ($V_{INT}$) of amplifier 335 during a comparison phase (Phase 3 and Phase 4).

System 301 includes a frequency to voltage circuit 303, which is a multi-phase frequency to voltage circuit. Circuit 303 includes a variable resistor 313, capacitors 317, 319, and 321, and switches 315, 314, and 323. Switch 314 closes to charge capacitor 317 during Phase 1. Switch 315 is closed to discharge capacitor 317 during Phase 4. The voltage level $V_{FB}$ is dependent upon the frequency of the oscillation signals $OS_{PH1}$ and $OS_{PH4}$ with a higher frequency providing for a higher voltage of $V_{FB}$. Unlike circuit 107, voltage $V_{FB}$ is referenced to the high power supply voltage (VDD) instead of the low power supply voltage (ground). In the embodiments of FIGS. 1 and 2, $V_{FB}$ is referenced to ground. Capacitors 317, 319, and 321 each include an electrode connected to the VDD power supply terminal.

Circuit 303 includes a sampling phase (Phase 2) where switch 323 is closed for capacitor 321 to sample and hold the voltage ($V_{FB}$) of node 316. Capacitor 321 provides the sampled voltage $V_{FB}$ to the non inverting input of amplifier 335 during a comparison phase (Phase 3, Phase 4) of comparison circuit 307. One advantage that may occur with providing a sampled voltage to the non inverting input of amplifier 335 during a comparison phase is that it provides for a more stable voltage and it may allow for a reduction in the size of capacitor 319. In some embodiments, a switch may be added in series with resistor 313 to further reduce power consumption of circuit 303 during some of the phases or to reduce the resistor size of resistor 313.

System 301 includes a reference voltage generator 305 that includes resistors 325 and 327 that implement a voltage divider for providing the reference voltage $V_{REF}$. In the embodiment shown, $V_{REF}$ is referenced to the high power supply voltage VDD with capacitor 329. In one embodiment, having $V_{REF}$ and $V_{FB}$ being produced from the same power supply (VDD) provides for the same impedance characteristics of each voltage source thereby making the comparison by circuit 307 independent of power supply ripple.

Except for a few differences, comparison circuit 307 works in a similar way as the comparison circuits 109 of FIGS. 1 and 2 in comparing the voltage of $V_{FB}$ to the voltage of $V_{REF}$ to generate voltage $V_{INT}$ at the output of amplifier 335 during a comparison phase of circuit 307. One difference is that the voltage $V_{FB}$, the output voltage of amplifier 335, the reference voltage $V_{REF}$, and the sampled voltage of capacitor 337 are referenced to the high power supply voltage VDD in FIG. 3 instead of to the low power supply voltage (ground) as with comparison circuits 109 of FIGS. 1 and 2. Referencing these voltages as well as $V_{INT}$ to the high power supply voltage VDD and referencing CCO 347 to system ground, may in some embodiments, provide for an oscillation system with a relatively high power supply rejection.

Another difference with comparison circuit 307 as compared to circuit 109 is that circuit 307 is in a comparison phase (Phase 3 and Phase 4) for twice as long as it is in a sampling phase (Phase 1). Switches 339 and 331 are closed only during Phase 1 for sampling the reference voltage whereas switches 333 and 341 are closed for both Phase 3 and Phase 4 for comparing $V_{FB}$ to the sampled voltage of capacitor 337. In other embodiments, switches 331 and 339 could be closed during Phase 2 or switches 333 and 341 could be open during one of Phase 3 or Phase 4.

Figure 5:
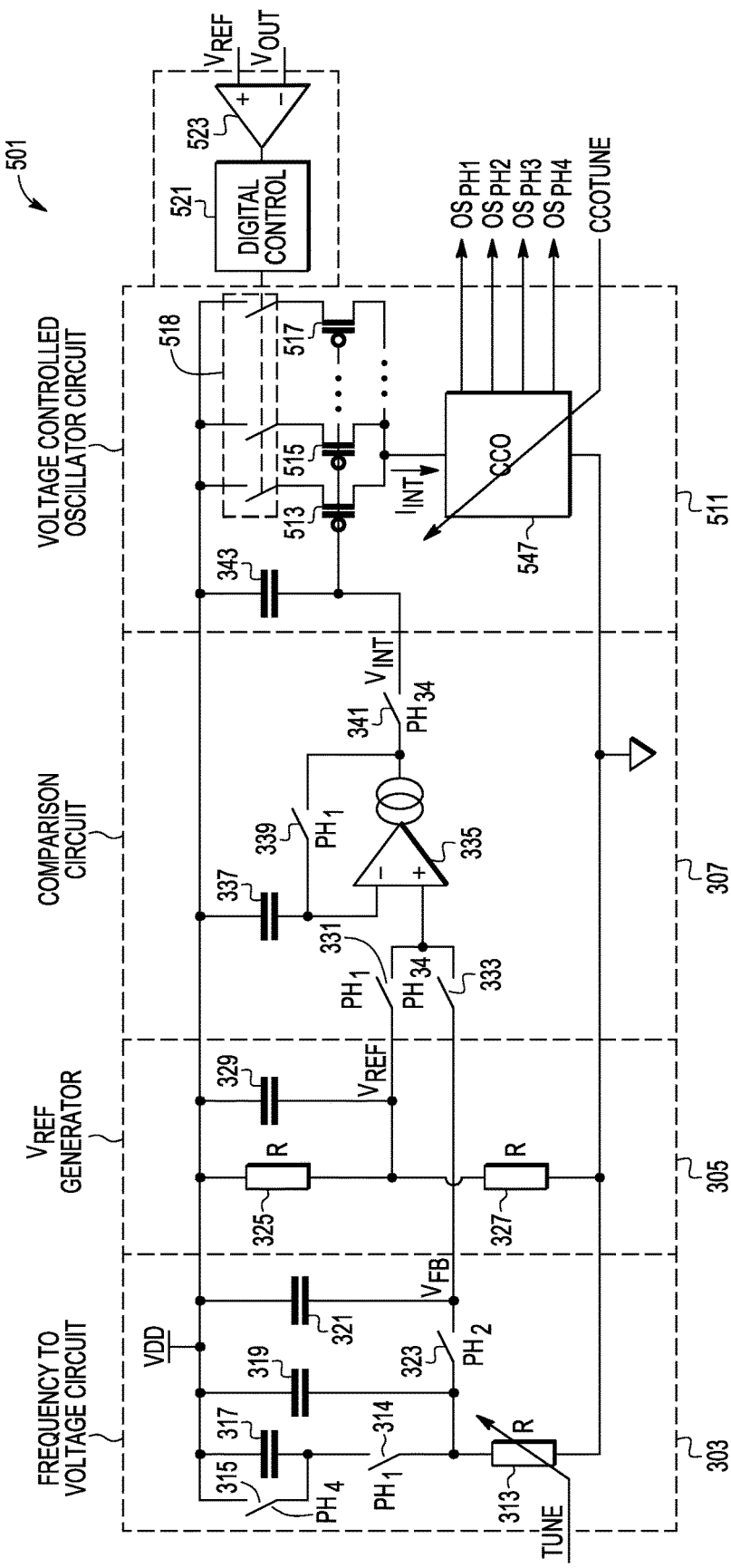
FIG. 5 is a circuit diagram of an oscillator system according to another embodiment of the present invention.

FIG. 5 is a circuit diagram of another embodiment of an oscillator system 501. Oscillator system 501 is similar to oscillator system 301 where the same reference numbers indicate similar devices and functions. VCO circuit 511 is different from VCO circuit 311 in that current controlled oscillator 547 is tunable with a CCOTUNE value to optimize the frequency response of CCO 547 to the input current INT over a large frequency range. In some embodiments, the CCOTUNE values can be set to tune to a desired frequency range, to tune for a certain CCO voltage, to compensate for a variation in power supply voltages, to improve phase noise performance, to compensate for temperature, and/or to control current consumption. In one embodiment, the CCOTUNE value is provided by a system controller (not shown).

System 501 also includes a negative feedback loop circuit 510 and a voltage to current converter circuit implemented with multiple parallel P channel transistors 513, 515, and 517 that can be individually switched in and out based on a desired voltage to current conversion factor provided by digital control 521. Digital control 521 selects the desired voltage to current factor by selectively enabling transistors 513, 515, and 517 with switches 518 based on a comparison of $V_{REF}$ to $V_{INT}$ by comparator 523, thereby controlling the frequency response of circuit 511 to $V_{INT}$. Transistor 513, 515, and 517 have their drain terminals connected together and to the input of CCO 547. In one embodiment, transistors 513, 515, and 517 may be of different sizes for linearizing the voltage to frequency response. Other types of voltage to current converter devices may be used in other embodiments. In other embodiments, the digital control 521 controls CCOtune or controls both CCOtune and the enabling switches 518 for transistors 513, 515, and 517. In another embodiment, other signals beside $V_{INT}$, $V_{REF}$ can be used in the comparison for optimizing the oscillator system 501.

Figure 6:
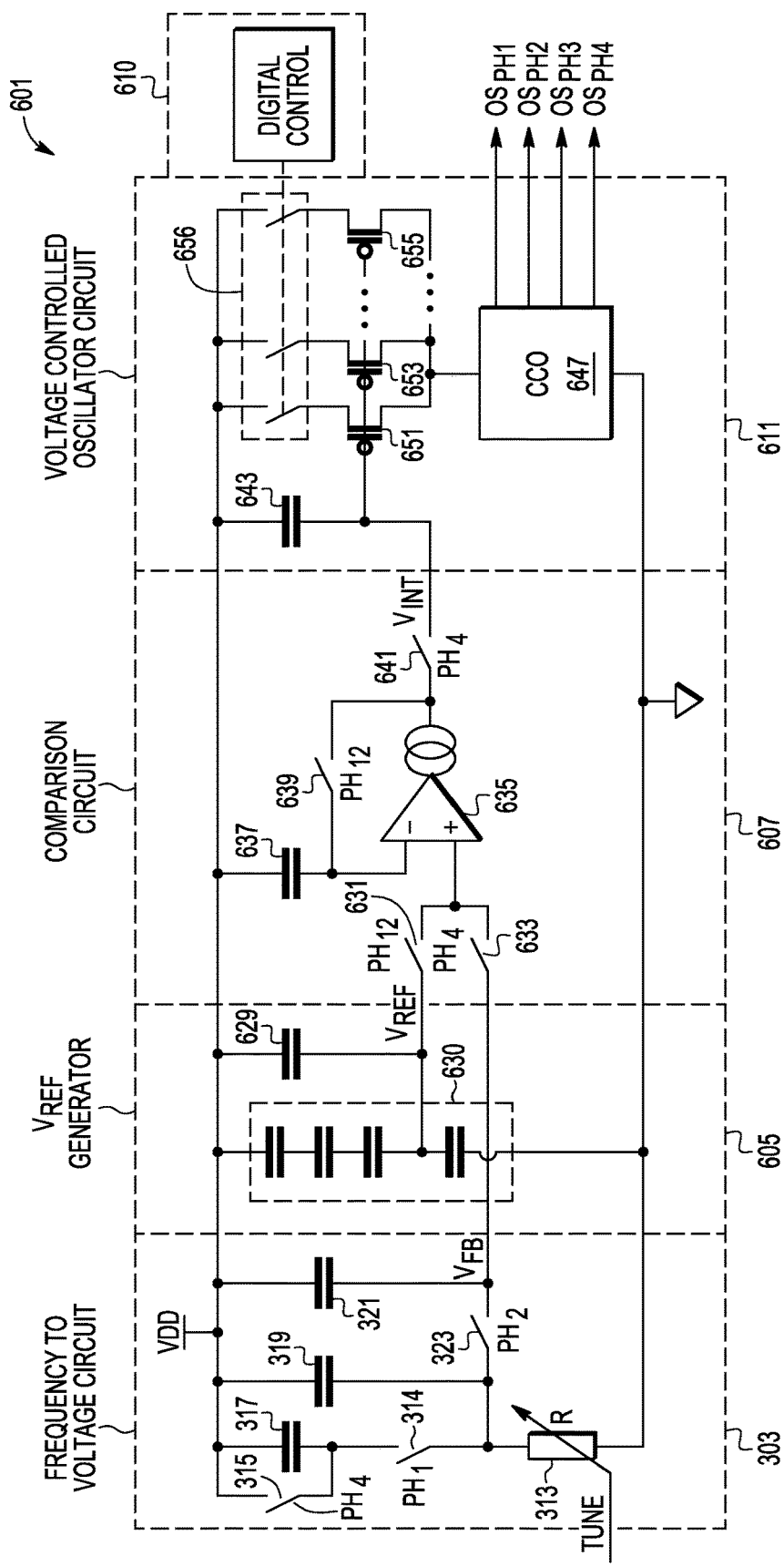
FIG. 6 is a circuit diagram of an oscillator system according to another embodiment of the present invention.

FIG. 6 sets forth an oscillator system 601 according to another embodiment of the present invention. System 601 includes a VCO circuit 611 that includes a CCO 647 that produces four phase shifted oscillation signals $OS_{PH1}$, $OS_{PH2}$, $OS_{PH3}$, and $OS_{PH4}$. Circuit 611 includes a voltage to current circuit implemented with P channel transistors 651, 653, and 655. A digital control circuit 610 controls which of the P-channel transistors are enabled at a particular time by selectively closing and opening switches 656. The digital control can be a static value stored in a memory or a dynamic value from the system inside or outside the integrated circuit. Optimization can be done for frequency stability, power consumption or phase noise. Circuit 611 also includes a capacitor 643 for sampling and holding the input voltage $V_{INT}$ during a comparison phase of circuit 607.

System 601 includes a frequency to voltage conversion circuit 303 similar to the frequency to voltage conversion circuits of FIGS. 3 and 5.

The voltage reference circuit 605 is implemented as a capacitor voltage divider circuit 630. In the embodiment shown, $V_{REF}$ is referenced to the high power supply voltage VDD by means of capacitor 329. In some embodiments, capacitor voltage divider circuit 630 may be a switched capacitor voltage divider circuit. In some embodiments, using a capacitor voltage divider circuit may provide a more power efficient reference voltage circuit that consumes less power or occupies less area than a resistor voltage divider.

Comparison circuit 607 is similar to comparison circuit 307 of FIGS. 3 and 5 except that switches 631 and 639 are closed during Phases 1 and 2 for sampling the output of amplifier 635 with capacitor 637. Switches 633 and 641 are closed only during Phase 4 for comparing sampled voltage $V_{FB}$ with the sampled voltage held in capacitor 637 during a comparison phase. Like the systems of FIGS. 3 and 5, $V_{FB}$, $V_{REF}$, the sample voltage held in capacitor 637, and $V_{INT}$ are all referenced to VDD, but could be referenced to ground in other embodiments.

Although FIGS. 3, 5, and 6 describe oscillation systems that implement more than two phases for their operations, these systems may be implemented with two phases in other embodiments.

As used herein, "sampling and holding" a voltage by a capacitor means that the actual voltage is stored or a divided voltage of the actual voltage is stored on the capacitor.

Features shown or described with respect to one embodiment may be implemented with other embodiments shown or described. For example, CCO 647 can be tunable in some embodiments. Also, $V_{REF}$, $V_{FB}$, and $V_{INT}$ of systems 105 and 205 may be referenced to VDD with some modifications to system 205.

In one embodiment, an oscillator system includes a voltage controlled oscillator circuit. The voltage controlled oscillator circuit includes an input to receive an input voltage and an output to provide an oscillation signal. The input voltage controls a frequency of the oscillation signal. The oscillator system includes a frequency to voltage circuit. The frequency to voltage circuit includes an input to receive the oscillation signal. The frequency to voltage circuit including an output for producing a voltage dependent on a frequency of the oscillation signal. The oscillator system includes a comparison circuit including an amplifier. The amplifier includes an inverting input, a non inverting input, and an output. During a sampling phase of the comparison circuit, the non inverting input receives a reference voltage and the inverting input is coupled at least via a first switch to the output of the amplifier and is coupled to a first capacitor wherein a voltage of the output of the amplifier is sampled by the first capacitor. During a comparison phase of the comparison circuit, the first switch is open and the non inverting amplifier receives a voltage generated by the output of the frequency to voltage circuit and the inverting input is coupled to the first capacitor. The voltage of the output of the amplifier is provided to the input of the voltage controlled oscillator circuit during the comparison phase.

In another embodiment, a method of operating an oscillator system includes operating the oscillator system during a plurality of phases of a comparison circuit of the oscillator system occurring periodically. The method includes during a first phase of the plurality of phases, providing a reference voltage to a non inverting input of an amplifier. An inverting input is coupled at least via a first switch to an output of the amplifier and is coupled to a capacitor. A voltage of the output of the amplifier is provided to the capacitor for sampling by the capacitor. The method includes during a second phase of the plurality of phases, providing an output voltage from a frequency to voltage circuit to the non inverting input and providing the voltage of the output of the amplifier to a voltage controlled oscillator circuit for controlling a frequency of an oscillation signal outputted by the voltage controlled oscillator circuit. During the second phase, the capacitor is coupled to the inverting input, the switch is open, and the voltage of the output of the amplifier is not provided to the capacitor for sampling by the capacitor. The oscillation signal is provided to the frequency to voltage circuit. The output voltage of the frequency to voltage circuit is dependent on the frequency of the oscillation signal.

In another embodiment, a method of operating an oscillator system includes during a sampling phase of a comparison circuit, providing a reference voltage to a non inverting input of an amplifier, providing a voltage of an output of the amplifier to an inverting input of the amplifier and to a capacitor to sample the voltage of the output. The method includes during a second phase of the comparison circuit, providing an output voltage from a frequency to voltage circuit to the non inverting input, providing the voltage of the output of the amplifier to a voltage controlled oscillator circuit for controlling a frequency of an oscillation signal outputted by the voltage controlled oscillator circuit, providing a held voltage from the capacitor to the non inverting input, and not providing the voltage of the output of the amplifier to the capacitor for sampling. The oscillation signal is provided to the frequency to voltage circuit. The output voltage of the frequency to voltage circuit is dependent on the frequency of the oscillation signal. The sampling phase and the comparison phase occur at a frequency that is controlled by the voltage controlled oscillator circuit.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. An oscillator system comprising:
   a voltage controlled oscillator circuit including an input to receive an input voltage and an output to provide an oscillation signal, the input voltage controls a frequency of the oscillation signal;
   a frequency to voltage circuit, the frequency to voltage circuit including an input to receive the oscillation signal, the frequency to voltage circuit including an output for producing a voltage dependent on a frequency of the oscillation signal;
   a comparison circuit including an amplifier, the amplifier includes an inverting input, a non inverting input, and an output, during a sampling phase of the comparison circuit, the non inverting input receives a reference voltage and the inverting input is coupled at least via a first switch to the output of the amplifier and is coupled to a first capacitor wherein a voltage of the output of the amplifier is sampled by the first capacitor, wherein during a comparison phase of the comparison circuit, the first switch is open and the non inverting amplifier receives a voltage generated by the output of the frequency to voltage circuit and the inverting input is coupled to the first capacitor, wherein the voltage of the output of the amplifier is provided to the input of the voltage controlled oscillator circuit during the comparison phase.

2. The oscillator system of claim 1 wherein the comparison circuit includes a second switch and the voltage controlled oscillator circuit includes a second capacitor, wherein during a comparison phase of the comparison circuit, the second switch is closed to sample the voltage of the output of the amplifier by the second capacitor, wherein during the sampling phase of the comparison circuit, the second switch is open.

3. The oscillator system of claim 1 wherein the frequency to voltage circuit includes a second capacitor, and a second switch, wherein during a sampling phase of the frequency to voltage circuit, the second switch is closed to sample the voltage dependent on a frequency of the oscillation signal by the second capacitor, wherein during a non sampling phase of the frequency to voltage circuit, the second switch is open.

4. The oscillator system of claim 1 further comprising a high voltage power supply terminal and a low voltage power supply terminal, wherein the reference voltage, the voltage of the output of the amplifier, and the voltage of the output of the frequency to voltage circuit are each referenced to the high voltage power supply terminal.

5. The oscillator system of claim 1 further comprising:
   a second comparison circuit including an input to receive the reference voltage, a second input coupled to the input of the voltage controlled oscillator circuit to receive the input voltage, and an output to control a frequency response of the voltage controlled oscillator circuit with respect to the input voltage.

6. The oscillator system of claim 5 wherein the second comparison circuit includes a filter having a pass band frequency range that is lower than a frequency of the oscillation signal.

7. The oscillator system of claim 5 wherein the second comparison circuit include a comparator and a digital control circuit, where the comparator compares the reference voltage to the input voltage of the voltage controlled oscillator circuit, an output of the comparator is provided to the digital control circuit that produces the output of the comparison circuit.

8. The oscillator system of claim 1 wherein the sampling phase and comparison phase occur periodically as determined by the voltage controlled oscillator circuit.

9. The oscillator system of claim 1 wherein the voltage controlled oscillator circuit includes:
   a current controlled oscillator, the current controlled oscillator including an input to receive an input current for controlling the frequency of the oscillation signal;
   a voltage to current converter circuit for converting the input voltage to the input current.

10. The oscillator system of claim 9 wherein the voltage to current converter circuit includes a plurality of switchable voltage to current devices located in parallel and individually selectable, each switchable voltage to current device of the plurality of switchable voltage to current devices including an input to receive the input voltage and a terminal coupled via at least a current path to the input of the current controlled oscillator.

11. The oscillator system of claim 1 wherein:
   the voltage controlled oscillator circuit includes a second output to provide a second oscillation signal, the input voltage controls a frequency of the second oscillation signal, the second oscillation signal being out of phase with the oscillation signal;
   the frequency to voltage circuit includes an input to receive the second oscillation signal, the voltage produced by the output of the frequency to voltage circuit is dependent on a frequency of the second oscillation signal.

12. A method of operating an oscillator system, the method including operating the oscillator system during a plurality of phases of a comparison circuit of the oscillator system occurring periodically, the method comprising:

during a first phase of the plurality of phases, providing a reference voltage to a non inverting input of an amplifier, wherein an inverting input is coupled at least via a first switch to an output of the amplifier and is coupled to a capacitor, wherein a voltage of the output of the amplifier is provided to the capacitor for sampling by the capacitor;

during a second phase of the plurality of phases, providing an output voltage from a frequency to voltage circuit to the non inverting input and providing the voltage of the output of the amplifier to a voltage controlled oscillator circuit for controlling a frequency of an oscillation signal outputted by the voltage controlled oscillator circuit, wherein during the second phase, the capacitor is coupled to the inverting input, the switch is open, and the voltage of the output of the amplifier is not provided to the capacitor for sampling by the capacitor;

wherein the oscillation signal is provided to the frequency to voltage circuit, the output voltage of the frequency to voltage circuit is dependent on the frequency of the oscillation signal.

13. The method of claim 12 where during the second phase, the output of the amplifier is provided to a second capacitor of the voltage controlled oscillator circuit for sampling the voltage of the output of the amplifier, wherein during the first phase, the voltage of the output of the amplifier is not provided to the second capacitor for sampling the voltage of the output of the amplifier.

14. The method of claim 12 wherein the plurality of phases occurs at a frequency that is controlled by the voltage controlled oscillator circuit.

15. The method of claim 12 further comprising:
comparing the reference voltage with the output voltage of the amplifier provided to the voltage controlled oscillator circuit to control a frequency response of the voltage controlled oscillator circuit with respect to the output voltage of the amplifier provided to the voltage controlled oscillator circuit.

16. The method of claim 12 further comprising sampling by a second capacitor of the frequency to voltage circuit during a phase of the frequency to voltage circuit a voltage that is dependent upon the frequency of the oscillation signal, wherein during the second phase, the output voltage of the frequency to voltage circuit is provided from the second capacitor to the non inverting input of the amplifier.

17. The method of claim 12 wherein the oscillator system includes a high power supply voltage terminal and a low power supply voltage supply terminal, wherein the reference voltage, the output voltage of the frequency to voltage circuit, and the voltage of the output of the amplifier are each referenced to the high power supply voltage terminal.

18. The method of claim 12 wherein the voltage controlled oscillator circuit includes a current controlled oscillator including an output to provide the oscillation signal, wherein the method includes converting the voltage of the output of the amplifier provided to the voltage controlled oscillator circuit to an input current, wherein the frequency of the oscillation signal is controlled by the input current.

19. The method of claim 18 wherein the converting includes converting with a voltage to current converter circuit including a plurality of individually selectable voltage to current converting devices arranged in a parallel configuration, wherein the converting includes converting the voltage with less than all of the plurality of the voltage to current converting devices selected.

20. A method of operating an oscillator system, the method comprising:

during a sampling phase of a comparison circuit, providing a reference voltage to a non inverting input of an amplifier, providing a voltage of an output of the amplifier to an inverting input of the amplifier and to a capacitor to sample the voltage of the output;

during a second phase of the comparison circuit, providing an output voltage from a frequency to voltage circuit to the non inverting input, providing the voltage of the output of the amplifier to a voltage controlled oscillator circuit for controlling a frequency of an oscillation signal outputted by the voltage controlled oscillator circuit, providing a held voltage from the capacitor to the non inverting input, and not providing the voltage of the output of the amplifier to the capacitor for sampling;

wherein the oscillation signal is provided to the frequency to voltage circuit, the output voltage of the frequency to voltage circuit is dependent on the frequency of the oscillation signal;

wherein the sampling phase and the comparison phase occur at a frequency that is controlled by the voltage controlled oscillator circuit.

\* \* \* \* \*